United States Patent
Teraguchi (10) Patent No.: US 7,145,237 B2
(45) Date of Patent: Dec. 5, 2006

(54) ELECTRODE EMPLOYING NITRIDE-BASED SEMICONDUCTOR OF III–V GROUP COMPOUND, AND PRODUCING METHOD THEREOF

(75) Inventor: Nobuaki Teraguchi, Oji-cho (JP)

(73) Assignee: Sharp Kabushiki Kaishi, Osaka (JP)

( * ) Notice: Subject to any disclaimer, the term of this patent is extended or adjusted under 35 U.S.C. 154(b) by 0 days.

(21) Appl. No.: 10/771,566

(22) Filed: Feb. 3, 2004

(65) Prior Publication Data

US 2004/0164415 A1    Aug. 26, 2004

(30) Foreign Application Priority Data

Feb. 25, 2003    (JP)    ............................. 2003-047701

(51) Int. Cl.
  *H01L 23/48*    (2006.01)
  *H01L 23/52*    (2006.01)
  *H01L 29/40*    (2006.01)
(52) U.S. Cl. ........................ 257/745; 257/734; 257/744
(58) Field of Classification Search ................ 257/745, 257/734, 744
See application file for complete search history.

(56) References Cited

U.S. PATENT DOCUMENTS

| 4,289,822 | A  | * | 9/1981 | Shimada et al. | ............ | 428/212 |
| 6,479,836 | B1 | * | 11/2002 | Suzuki et al. | ................. | 257/15 |
| 6,693,352 | B1 | * | 2/2004 | Huang et al. | ............... | 257/743 |
| 2003/0196692 | A1 | * | 10/2003 | Koyanagi et al. | ........... | 136/263 |
| 2003/0230970 | A1 | * | 12/2003 | Steckl et al. | ................ | 313/498 |

FOREIGN PATENT DOCUMENTS

JP    5-291621    5/1993

OTHER PUBLICATIONS

Ruvimov, S. et al. (1998). "Microstructure of Ti/Al Ohmic Contacts for n-AlGaN," *Appl. Phys. Lett.* 73(18):2582-2584.

* cited by examiner

*Primary Examiner*—Nitin Parekh
(74) *Attorney, Agent, or Firm*—Morrison & Foerster LLP (57) ABSTRACT

An electrode employing a nitride-based semiconductor of III–V group compound having a favorable ohmic characteristic and a producing method thereof are provided. The electrode includes a nitride-based semiconductor layer of III–V group compound, an electrode metal, and a metal oxide inserted therebetween. The metal oxide is preferably an oxide of metal element(s) permitting formation of a nitride semiconductor.

2 Claims, 4 Drawing Sheets

FERMI LEVEL $Eg_{GaN}$

FIG.2B

TUNNELING CURRENT IS SMALL $Eg_{AlGaN}$

FIG.2C

TUNNELING CURRENT IS LARGE $Eg_{AlGaN}$

FIG.2D

TUNNELING CURRENT INCREASES CONSIDERABLY $Eg_{AlGaInN}$ $Eg_{AlGaN}$

ELECTRODE EMPLOYING NITRIDE-BASED SEMICONDUCTOR OF III–V GROUP COMPOUND, AND PRODUCING METHOD THEREOF

This nonprovisional application is based on Japanese Patent Application No. 2003-047701 filed with the Japan Patent Office on Feb. 25, 2003, the entire contents of which are hereby incorporated by reference.

BACKGROUND OF THE INVENTION

1. Field of the Invention

The present invention relates to an electrode employing a nitride-based semiconductor of III–V group compound that is formed as an ohmic electrode of low contact resistance, and a producing method thereof.

2. Description of the Background Art

A nitride-based semiconductor of III–V group compound is excellent in thermostability and allows control of a bandgap width by changing its composition. Thus, it can be used for various semiconductor devices including light-emitting devices and high-temperature devices.

Conventionally, in an electrode employing a nitride-based semiconductor of III–V group compound, a multilayered structure has widely been used to ensure a favorable ohmic characteristic of low contact resistance for the nitride-based semiconductor of III–V group compound. It is reported in Japanese Patent Laying-Open No. 5-291621 that an electrode employing a gallium nitride doped with an n type impurity or non-doped GaN as the nitride-based semiconductor of III–V group compound and combined with a multilayered structure of Ti and Al exhibits a favorable ohmic characteristic with low contact resistance of $1\times10^{-7}$ $\Omega cm^2$ to $1\times10^{-6}$ $\Omega cm^2$.

In the above-described case, however, if AlGaN is employed as the nitride-based semiconductor of III–V group compound and it is combined with a multilayered structure of Ti and Al, the contact resistance increases along with an increase of a content ratio of Al within the group III metals in the semiconductor (hereinafter, referred to as the "Al composition ratio"). This is because the bandgap of AlGaN itself becomes large when AlGaN of a high Al composition ratio is employed, which leads to an increased potential barrier with respect to a metal. It is also reported, in Appl. Phys. Lett. Vol. 73 (1998), pp. 2582–2584, that the contact resistance becomes $2.1\times10^{-3}$ $\Omega cm^2$ when the Al composition ratio is 22%, with which the favorable ohmic characteristic cannot be expected.

SUMMARY OF THE INVENTION

The present invention has been made to solve the above-described problems. An object of the present invention is to provide an electrode employing a nitride-based semiconductor of III–V group compound having a favorable ohmic characteristic, irrelevant to the composition of the nitride-based semiconductor of III–V group compound to be employed. More particularly, an object of the present invention is to provide an electrode employing a nitride-based semiconductor of III–V group compound having a favorable ohmic characteristic of not greater than $1\times10^{-4}$ $\Omega cm^2$, without a considerable increase in contact resistance even in the case of employing AlGaN having a high Al composition ratio as the nitride-based semiconductor of III–V group compound compared to the case of employing GaN.

The present invention provides an electrode employing a nitride-based semiconductor of III–V group compound and a producing method of the same, which are characterized in that a metal oxide is inserted between a nitride-based semiconductor layer of III–V group compound and an electrode metal, where the metal oxide is an oxide of metal element(s) permitting formation of a nitride semiconductor.

According to the electrode of the present invention, the metal oxide is inserted between the nitride-based semiconductor layer of III–V group compound and the electrode metal. Thus, a nitride semiconductor having a small bandgap is formed in the vicinity of the interface between the nitride-based semiconductor layer of III–V group compound and the metal oxide. Furthermore, a conductive layer of high carrier concentration is formed in the vicinity of the interface, since oxygen within the metal oxide serves as a donor. As such, even in the case of employing AlGaN having a high Al composition ratio, an electrode having an extremely low contact resistance of not greater than $1\times10^{-4}$ $\Omega cm^2$ can be obtained. Accordingly, it is possible to provide an electrode having an excellent ohmic characteristic.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The electrode of the present invention has a metal oxide inserted between a nitride-based semiconductor layer of III–V group compound and an electrode metal. In particular, the metal oxide is either a metal oxide having a bandgap of not greater than 3.0 eV, or an oxide of metal element(s) permitting formation of a nitride semiconductor. Further, the electrode is formed by inserting the metal oxide between the nitride-based semiconductor layer of III–V group compound and the electrode metal in an oxygen-deficient state.

<Structure of Electrode>

A general structure of the electrode of the present invention is described with reference to FIG. 1.

Figure 1:
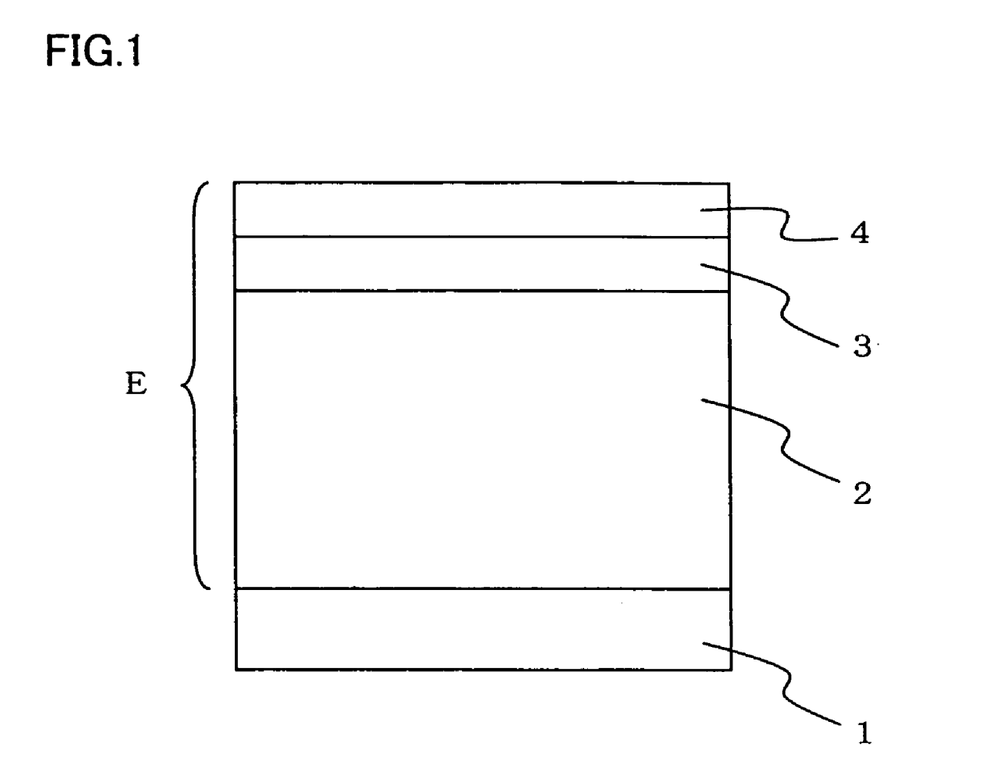
FIG. 1 is a cross sectional view showing a configuration of an electrode according to the present invention.

Referring to FIG. 1, an electrode E of the present invention arranged on a substrate 1 includes a nitride-based semiconductor layer 2 of III–V group compound, a metal oxide 3, and an electrode metal 4.

<Metal Oxide>

Preferably, the metal oxide used for the electrode of the present invention is a semiconductor having a bandgap of not greater than 3.0 eV, and more preferably not greater than 2.0 eV. If the bandgap of the metal oxide is greater than 3.0 eV, the metal oxide itself becomes a potential barrier, in which case it will be difficult to obtain an electrode of low contact resistance.

The metal for the metal oxide includes at least one of indium (In), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Each of these metals allows formation of a nitride-based semiconductor of III–V group compound, and has a possibility to form a nitride-based semiconductor of III–V group compound having a bandgap smaller than that of GaN.

Preferably, the metal oxide as described above is inserted in a thickness of 1–50 nm between the nitride-based semiconductor layer of III–V group compound and the electrode metal. If the metal oxide is thinner than 1 nm, it will be difficult to form an adequate intermediate layer between the electrode metal and the nitride-based semiconductor layer of III–V group compound, so that the contact resistance cannot be reduced sufficiently. If the metal oxide is thicker than 50 nm, part of the metal oxide will remain unreacted with the nitride-based semiconductor of III–V group compound, again hindering sufficient reduction of the contact resistance.

<Nitride-based Semiconductor Layer of III–V Group Compound>

In the electrode of the present invention, GaN, AlGaN, AlInN, AlGaInN, BAlGaN, BAlGaInN and others may be used as the nitride-based semiconductor of III–V group compound. Reduction of the contact resistance by insertion of the metal oxide is remarkable particularly when AlGaN is employed.

<Electrode Metal>

In the electrode of the present invention, besides Ti, Hf, Al and others, Ni, Pd, W, Au, Pt and others may be used as the electrode metal. If at least two metals are being employed, a multilayered structure may be formed therewith or they may be used as an alloy. Alternatively, a multilayered structure of at least two metals may preferably be subjected to annealing to form an alloy of the metals.

<Effects of Metal Oxide>

The effects of the metal oxide in the electrode of the present invention on the contact resistance are now described.

Figure 2A:
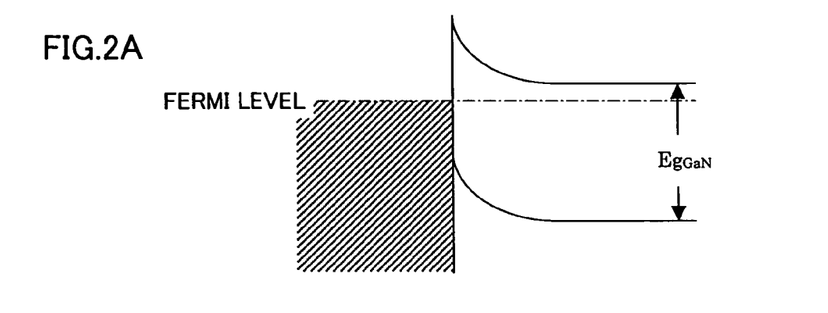
FIGS. 2A–2D show energy relation between an n-type nitride-based semiconductor layer and an electrode metal.
Figure 2B:
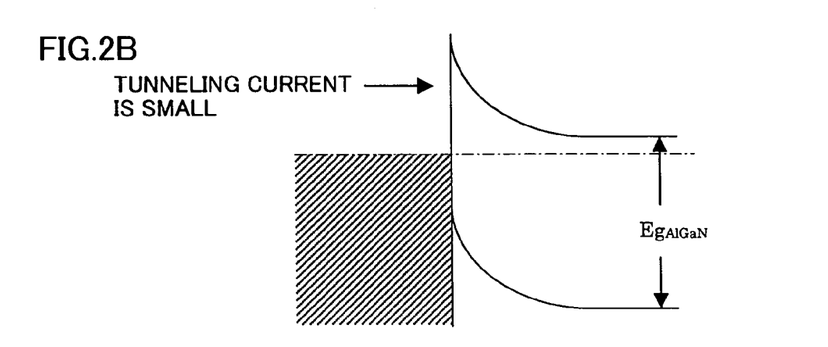

FIGS. 2A–2D show the energy relation between an n-type nitride-based semiconductor layer and an electrode metal. When GaN is employed as the n-type nitride-based semiconductor layer, a potential barrier is formed in the vicinity of the interface between the nitride-based semiconductor layer and the electrode metal due to a difference in Fermi level therebetween (FIG. 2A). When AlGaN is employed as the n-type nitride-based semiconductor layer, the potential barrier further increases, allowing only a small amount of tunneling current to flow (FIG. 2B). When a metal oxide is inserted between the semiconductor layer and the electrode metal, however, the tunneling current increases with the following two effects, so that the contact resistance of the electrode can be decreased considerably.

Figure 2C:
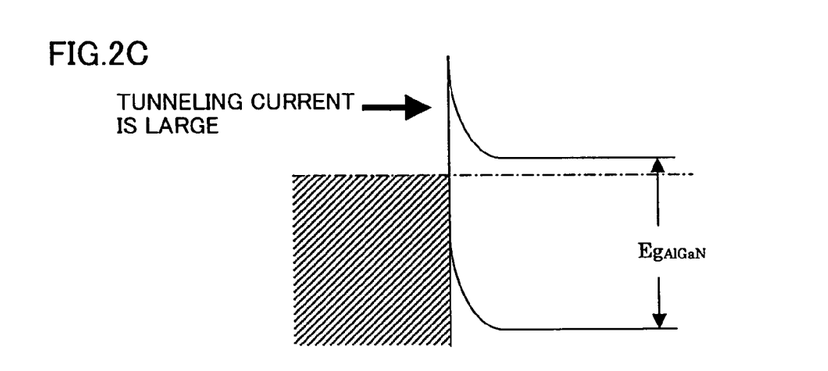

Firstly, oxygen included in the metal oxide serves as a donor to the nitride-based semiconductor of III–V group compound, forming a shallow donor level. Thus, an n-type conductive layer of high carrier concentration is formed in the vicinity of the interface between the nitride-based semiconductor layer of m-v group compound and the metal oxide. Accordingly, the tunneling current between the metal oxide and the nitride-based semiconductor layer of III–V group compound increases (FIG. 2C).

Figure 2D:
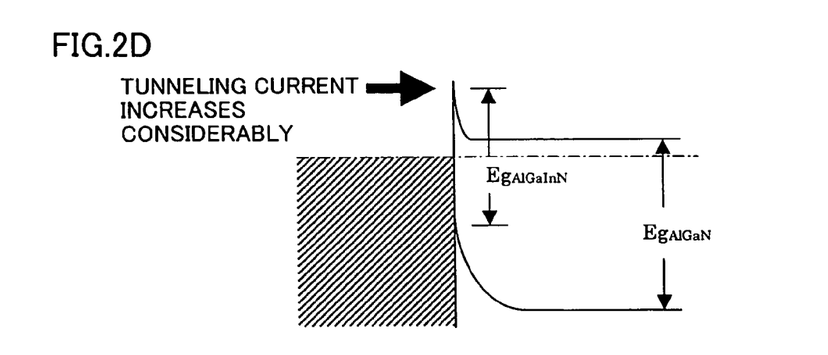

Secondly, the metal included in the metal oxide is reacted with nitrogen of the nitride-based semiconductor of III–V group compound, and a new nitride-based III–V group compound having a small bandgap is formed in the vicinity of the interface between the metal oxide and the nitride-based semiconductor layer of III–V group compound. At this time, the level of the potential barrier between the electrode metal and the semiconductor layer changes continuously, so that the effective barrier becomes low, and therefore, the tunneling current increases considerably (FIG. 2D).

<Producing Method of Electrode>

The electrode of the present invention may be produced by growing a nitride-based semiconductor layer 2 of III–V group compound on a substrate 1 in FIG. 1, for example, depositing a metal oxide 3 thereon preferably in the oxygen-deficient state, and by depositing an electrode metal 4 further thereon.

Substrate 1 used for formation of the electrode of the present invention may be sapphire ($Al_2O_3$), silicon carbide (SiC), silicon (Si), or the like. The nitride-based semiconductor of III–V group compound may be grown on the substrate by metallorganic chemical vapor deposition (MOCVD), molecular beam epitaxy (MBE), or the like.

Metal oxide 3 is deposited on the nitride-based semiconductor layer of III–V group compound, preferably in the oxygen-deficient state. In the state where oxygen is supplied, the metal oxide will become a semiconductor of high resistance, which forms an insulating layer between the nitride-based semiconductor layer of III–V group compound and the electrode metal, leading to an increased contact resistance of the electrode. In the oxygen-deficient state, the metal oxide itself becomes an n-type semiconductor. Electric conductivity increases compared to the case where stoichiometry is satisfied, and the bonding between the oxygen and the metals becomes loose, so that oxygen is apt to be taken into the nitride-based semiconductor of III–V group compound. Accordingly, a conductive layer of high carrier concentration is formed in the vicinity of the interface between the metal oxide and the nitride-based semiconductor layer of III–V group compound, and the contact resistance of the electrode decreases.

The metal oxide may be deposited on the nitride-based semiconductor layer of III–V group compound by sputtering or evaporation, such as electron beam (EB) evaporation, to facilitate formation of the oxygen-deficient state.

When sputtering is employed, it is preferable to make the introduced amount of oxygen not to exceed 20% of the Ar flow rate. Sputtering is highly reactive, so that the metal oxide will be deposited as a semiconductor of high resistance if the introduced amount of oxygen is more than 20% of the Ar flow rate. In such a case, an insulating layer will be formed between the nitride-based semiconductor layer of III–V group compound and the electrode metal, making it difficult to sufficiently decrease the contact resistance of the electrode. When evaporation is employed, which is lower in reactivity than sputtering, it is desirable to set partial pressure of oxygen not to exceed 1.5 Pa. If the partial pressure of oxygen is greater than 1.5 Pa, a metal oxide of high resistance will be deposited, again hindering sufficient reduction of the contact resistance of the electrode.

Annealing may be conducted after the metal oxide and the electrode metal are deposited on the nitride-based semiconductor layer of III–V group compound, for the purpose of alloying the nitride-based semiconductor, the metal oxide and the electrode metal. An optimal temperature for the annealing may be selected in accordance with the metal(s) constituting the metal oxide to be employed. In the case of indium oxide, for example, it is preferable to process the same at a temperature of 300–1000° C., particularly at about 650° C.

<State of use of Electrode of the Present Invention>

Figure 3:
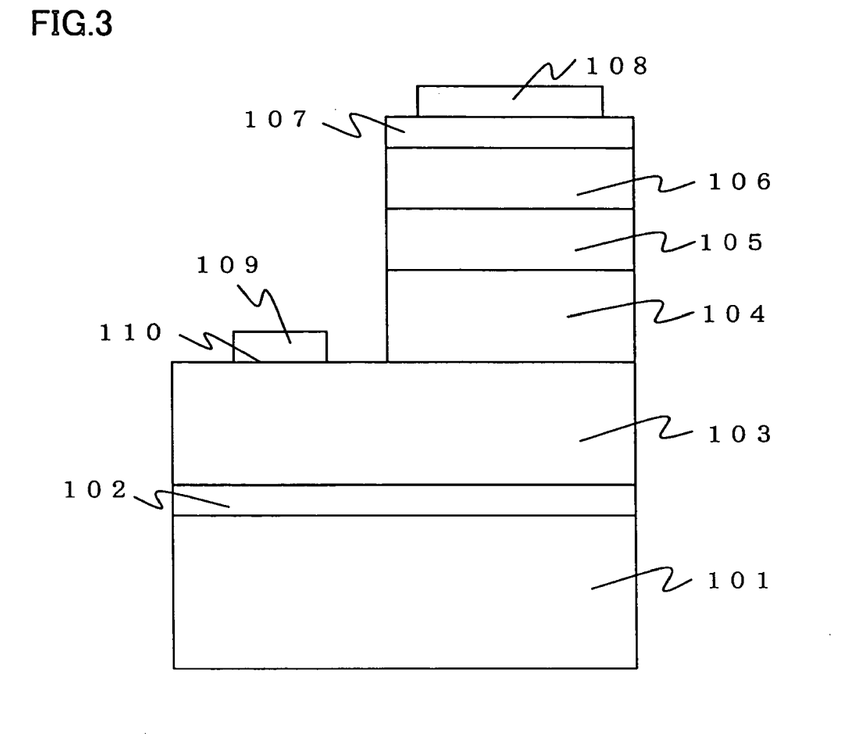
FIGS. 3 and 4 are cross sectional views showing, by way of example, states of use of the electrode of the present invention.
Figure 4:
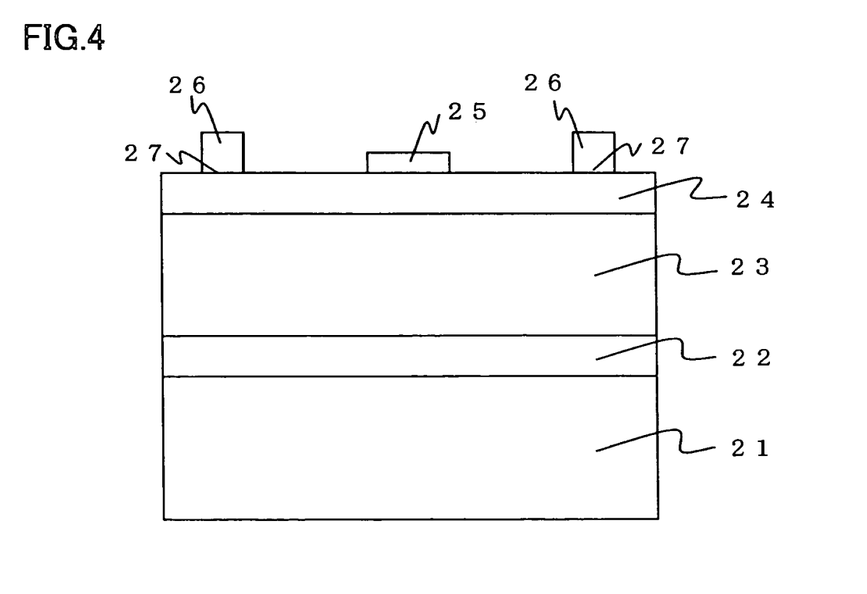

The electrode of the present invention may be employed for a nitride-based semiconductor device of III–V group compound, which may be, for example, a light-emitting device such as a light-emitting diode, a laser diode or the like, or an electronic device such as a field effect transistor (FET) or the like. FIG. 3 shows a light-emitting diode or a laser diode, and FIG. 4 shows a hetero-structure field effect transistor. The diode shown in FIG. 3 includes a sapphire substrate 101, and a buffer layer 102 and n-type GaN 103 deposited thereon. It further includes a structure of an n-type AlGaN clad layer 104, an active layer 105, a p-type AlGaN clad layer 106, a p-type GaN contact layer 107 and a p-type electrode 108 formed thereon, and also includes a structure of an n-type electrode 109 formed on n-type GaN 103. Here, a metal oxide 110 may be inserted between n-type GaN 103 and n-type electrode 109 to form an electrode of the present invention. The hetero-structure field effect transistor shown in FIG. 4 includes a sapphire or SiC substrate 21, an AlN or GaN buffer layer 22, a GaN channel layer 23, and an AlGaN barrier layer 24. It further includes a structure of a gate electrode 25 formed on AlGaN barrier layer 24, and also includes structures of source/drain electrodes 26 formed on AlGaN barrier layer 24. Here, a metal oxide 27 may be inserted between AlGaN barrier layer 24 and each of source/drain electrodes 26 to form an electrode of the present invention.

EXAMPLES

Hereinafter, examples of the present invention will be described. It is noted that they are shown by way of example, and the present invention is not limited thereto.

Example 1

In formation of the electrode having the structure as shown in FIG. 1, MOCVD was employed to grow $Al_{0.25}Ga_{0.75}N$ (carrier concentration: $1\times10^{18}$ $\Omega cm^{-3}$) as the nitride-based semiconductor of III–V group compound on a sapphire substrate 1. Indium oxide as the metal oxide was sputtered to a thickness of 5 nm with an RF input of 100W and at an Ar flow rate of 30 sccm. Further, as the electrode metal, titanium (Ti) was deposited to a thickness of 16 nm and aluminum (Al) was deposited to a thickness of 200 nm. Thereafter, annealing was conducted in a nitrogen atmosphere at 650° C. for 30 seconds.

Example 2

The electrode was formed in the same manner as in Example 1, except that GaN (silicon doped amount: $1\times10^{18}$ $\Omega cm^{-3}$) was employed as the nitride-based semiconductor of III–V group compound.

Example 3

The electrode was formed in the same manner as in Example 1, except that $Al_{0.1}Ga_{0.9}N$ (silicon doped amount: $1\times10^{18}$ $\Omega cm^{-3}$) was employed as the nitride-based semiconductor of III–V group compound.

Example 4

The electrode was formed in the same manner as in Example 1, except that $Al_{0.2}Ga_{0.8}N$ (silicon doped amount: $1\times10^{18}$ $\Omega cm^{-3}$) was employed as the nitride-based semiconductor of III–V group compound.

Example 5

The electrode was formed in the same manner as in Example 1, except that $Al_{0.3}Ga_{0.7}N$ (silicon doped amount: $1\times10^{18}$ $\Omega cm^{-3}$) was employed as the nitride-based semiconductor of III–V group compound.

Example 6

The electrode was formed in the same manner as in Example 1, except that $Al_{0.4}Ga_{0.6}N$ (silicon doped amount: $1\times10^{18}$ $\Omega cm^{-3}$) was employed as the nitride-based semiconductor of III–V group compound.

Example 7

The electrode was formed in the same manner as in Example 1, except that $Al_{0.5}Ga_{0.5}N$ (silicon doped amount: $1\times10^{18}$ $\Omega cm^{-3}$) was employed as the nitride-based semiconductor of III–V group compound.

Example 8

$Al_{0.25}Ga_{0.75}N$ (carrier concentration: $1\times10^{18}$ $\Omega cm^{-3}$) as the nitride-based based semiconductor of III–V group compound was grown on a sapphire substrate. Indium oxide as the metal oxide was sputtered to a thickness of 5 nm with an RF input of 100 W and at an Ar flow rate of 30 sccm. Further, 5 nm-thick hafinium (Hf) and 100 nm-thick aluminum (Al) were deposited as the electrode metal, followed by annealing in a nitrogen atmosphere at 900° C. for 30 seconds to form the electrode.

Example 9

The electrode was formed in the same manner as in Example 8, except that lanthanum oxide was used for the metal oxide.

Example 10

The electrode was formed in the same manner as in Example 8, except that cerium oxide was used for the metal oxide.

Example 11

The electrode was formed in the same manner as in Example 8, except that praseodymium oxide was used for the metal oxide and annealing was conducted at 800° C.

Example 12

The electrode was formed in the same manner as in Example 8, except that neodymium oxide was used for the metal oxide and annealing was conducted at 750° C.

Example 13

The electrode was formed in the same manner as in Example 8, except that promethium oxide was used for the metal oxide and annealing was conducted at 650° C.

Example 14

The electrode was formed in the same manner as in Example 8, except that samarium oxide was used for the metal oxide and annealing was conducted at 550° C.

Example 15

The electrode was formed in the same manner as in Example 8, except that europium oxide was used for the metal oxide and annealing was conducted at 500° C.

Example 16

The electrode was formed in the same manner as in Example 8, except that gadolinium oxide was used for the metal oxide and annealing was conducted at 800° C.

Example 17

The electrode was formed in the same manner as in Example 8, except that terbium oxide was used for the metal oxide and annealing was conducted at 800° C.

Example 18

The electrode was formed in the same manner as in Example 8, except that dysprosium oxide was used for the metal oxide and annealing was conducted at 600° C.

Example 19

The electrode was formed in the same manner as in Example 8, except that holmium oxide was used for the metal oxide and annealing was conducted at 650° C.

Example 20

The electrode was formed in the same manner as in Example 8, except that erbium oxide was used for the metal oxide and annealing was conducted at 700° C.

Example 21

The electrode was formed in the same manner as in Example 8, except that thulium oxide was used for the metal oxide and annealing was conducted at 500° C.

Example 22

The electrode was formed in the same manner as in Example 8, except that ytterbium oxide was used for the metal oxide and annealing was conducted at 450° C.

Example 23

The electrode was formed in the same manner as in Example 8, except that lutetium oxide was used for the metal oxide.

Comparative Example 1

The electrode was formed in the same manner as in Example 1, except that indium oxide was not deposited.

Comparative Example 2

The electrode was formed in the same manner as in Example 1, except that indium oxide was sputtered with an RF input of 100 W, an Ar flow rate of 30 sccm and an oxygen flow rate of 10 sccm.

<Measurement of Contact Resistance of Electrode>

Figure 5:
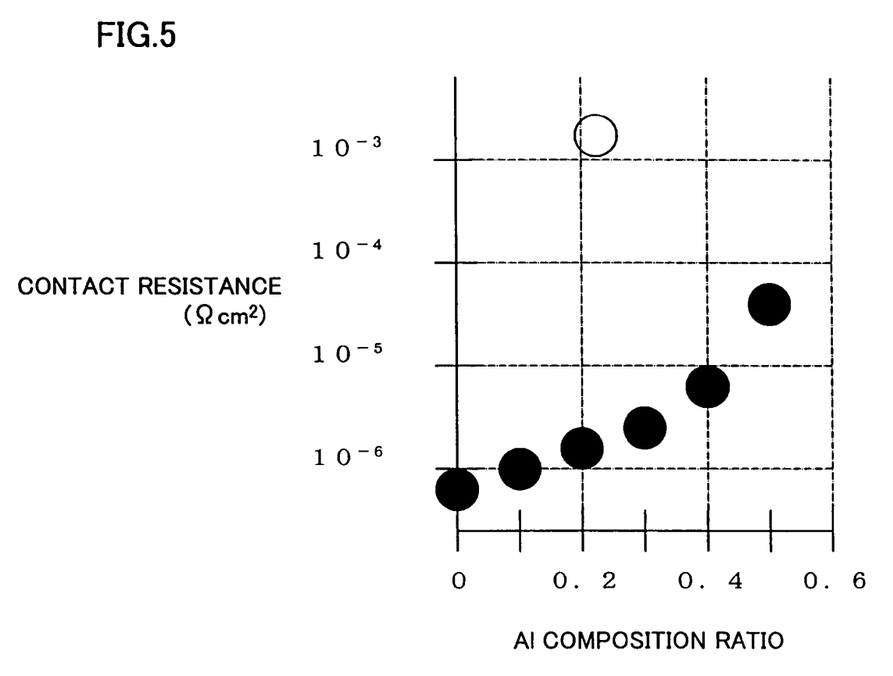
FIG. 5 illustrates an effect of reducing contact resistance in Examples 2–7 of the present invention.

For each of the electrodes obtained in the above-described Examples and Comparative Examples, contact resistance was measured by a transmission line model (TLM) method known in the art. The contact resistance values of Examples 1, 8–23 and Comparative Examples 1 and 2 are shown in Table 1. The contact resistance values of Examples 2–7 are shown in FIG. 5.

TABLE 1

|  | Contact resistance ($\Omega cm^2$) |
| --- | --- |
| Example 1 | $8.0 \times 10^{-6}$ |
| Example 8 | $8.0 \times 10^{-6}$ |
| Example 9 | $5.3 \times 10^{-5}$ |
| Example 10 | $5.5 \times 10^{-5}$ |
| Example 11 | $3.6 \times 10^{-5}$ |
| Example 12 | $3.3 \times 10^{-5}$ |
| Example 13 | $4.3 \times 10^{-5}$ |
| Example 14 | $2.5 \times 10^{-5}$ |
| Example 15 | $2.2 \times 10^{-5}$ |
| Example 16 | $3.3 \times 10^{-5}$ |
| Example 17 | $3.6 \times 10^{-5}$ |
| Example 18 | $3.0 \times 10^{-5}$ |
| Example 19 | $3.8 \times 10^{-5}$ |
| Example 20 | $3.5 \times 10^{-5}$ |
| Example 21 | $3.1 \times 10^{-5}$ |
| Example 22 | $1.2 \times 10^{-5}$ |
| Example 23 | $3.5 \times 10^{-5}$ |
| Comparative Example 1 | $2.0 \times 10^{-3}$ |
| Comparative Example 2 | $2.0 \times 10^{-2}$ |

<Comparison of Contact Resistances in the Presence/absence of Metal Oxide>

In Comparative Example 1 where indium oxide is not deposited, the contact resistance of the electrode is $2.0 \times 10^{-3}$ $\Omega cm^2$. By comparison, in Example 1 where indium oxide is deposited, the contact resistance of the electrode is $8.0 \times 10^{-6}$ $\Omega cm^2$. This proves considerable reduction of the contact resistance as a result of insertion of the metal oxide between the nitride-based semiconductor layer of III–V group compound and the electrode metal.

<Effects of Change of Al/Ga Ratio in Semiconductor Layer on Contact Resistance>

FIG. 5 illustrates an effect of reducing contact resistance in Examples 2–7 of the present invention. Specifically, in FIG. 5, the contact resistance values of Examples 2–7, employing the nitride-based semiconductors of III–V group compounds having different Al composition ratios, are compared with the contact resistance value reported in the above-described publication (Appl. Phys. Lett. Vol. 73 (1998), pp, 2582–2854). The contact resistance value in the publication is plotted with a white circle, and the contact resistance values of Examples 2–7 are plotted with black circles. The value in the publication is $2.1 \times 10^{-3}$ $\Omega cm^2$ where $Al_{0.22}Ga_{0.78}N$ was employed. As seen from FIG. 5, even Example 7 employing $Al_{0.5}Ga_{0.5}N$ acquires the contact resistance value that is lower than the value in the publication, proving the effect of considerably reducing the contact resistance in the examples of the present invention. Further, the contact resistance values of Examples 2–7 are all lower than $1.0 \times 10^{-4}$ $\Omega cm^2$, proving that sufficiently low contact resistance is ensured even if the Al composition ratio is very high at 50%. Accordingly, it is found that inserting the metal oxide between the semiconductor layer and the electrode metal considerably decreases the contact resistance, particularly when a nitride-based semiconductor of III–V group compound having a high Al composition ratio is employed.

<Effects of Change of Kind of Metal Oxide on Contact Resistance>

In Examples 9–23 where the metal oxides other than indium oxide were employed, the contact resistance values were all lower than $1.0 \times 10^{-4}$ $\Omega cm^2$. As such, it is found that insertion of the metal oxide is effective in reducing the contact resistance.

<Effects of Sputtering Condition (Oxygen-deficient State or Oxygen-introduced State) on Contact Resistance>

In Comparative Example 2 where oxygen was introduced during sputtering of the metal oxide, the contact resistance was high at $2.0 \times 10^{-2}$ $\Omega cm^2$. By comparison, in Example 1 where sputtering was conducted in the oxygen-deficient state, the contact resistance was low at $8.0 \times 10^{-6}$ $\Omega cm^2$. Accordingly, it is found that depositing the metal oxide in the oxygen-deficient state is effective in reducing the contact resistance.

According to the above-described results, it is found that inserting the metal oxide between the nitride-based semiconductor layer of III–V group compound and the electrode metal, particularly in the oxygen-deficient state, ensures considerable reduction of contact resistance of the electrode.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electrode employing a nitride-based semiconductor of III–V group compound, comprising:
    a nitride-based semiconductor layer of III–V group compound;
    an electrode metal;
    a metal oxide inserted between said nitride-based semiconductor layer of III–V group compound and said electrode metal; and
    a nitride semiconductor intermediate layer doped with oxygen, said nitride semiconductor intermediate layer formed during a heating process from said metal oxide and said nitride-based semiconductor layer of III–V group compound between said electrode metal and the underlying nitride based semiconductor layer of III–V group compound, wherein the metal of said metal oxide includes at least one of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu).

2. A nitride-based semiconductor device of III–V group compound comprising the electrode according to claim 1.

* * * * *

UNITED STATES PATENT AND TRADEMARK OFFICE
CERTIFICATE OF CORRECTION

PATENT NO. : 7,145,237 B2 Page 1 of 1
APPLICATION NO. : 10/771566
DATED : December 5, 2006
INVENTOR(S) : Nobuaki Teraguchi It is certified that error appears in the above-identified patent and that said Letters Patent is hereby corrected as shown below:

On The Title Page, Item -73-
In the Assignee:
Please replace "Sharp Kabushiki Kaishi" with --Sharp Kabushiki Kaisha--

Signed and Sealed this

Twenty-ninth Day of May, 2007

JON W. DUDAS
*Director of the United States Patent and Trademark Office*